(12) United States Patent
Kamiya

(10) Patent No.: US 6,714,278 B2
(45) Date of Patent: Mar. 30, 2004

(54) EXPOSURE APPARATUS

(75) Inventor: Saburo Kamiya, Chiba-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/907,763

(22) Filed: Jul. 19, 2001

(65) Prior Publication Data

US 2001/0050759 A1 Dec. 13, 2001

Related U.S. Application Data

(63) Continuation of application No. 09/580,870, filed on May 30, 2000, which is a continuation of application No. 08/977,495, filed on Nov. 24, 1997, now abandoned.

(30) Foreign Application Priority Data

Nov. 25, 1996 (JP) .............................. 8-313275
Oct. 14, 1997 (JP) .............................. 8-280574

(51) Int. Cl.⁷ .......................... G03B 27/52; G03B 27/42
(52) U.S. Cl. .......................................... 355/30; 355/53
(58) Field of Search .............................. 355/30, 53, 55, 355/67, 77; 356/399–401; 430/301, 311; 428/69, 71, 74

(56) References Cited

U.S. PATENT DOCUMENTS

| | | | |
|---|---|---|---|
| 4,564,284 A | 1/1986 | Tsutsui | 355/30 |
| 4,704,348 A | 11/1987 | Koizumi et al. | 430/327 |
| 4,726,974 A | 2/1988 | Nowobilski et al. | 428/69 |
| 4,732,177 A | 3/1988 | Maus et al. | 138/147 |
| 4,825,247 A | 4/1989 | Kemi et al. | 355/55 |
| 4,989,031 A | 1/1991 | Kamiya | 355/30 |
| 4,994,117 A | 2/1991 | Fehder | 436/133 |
| 5,011,729 A | 4/1991 | McAllister | 428/167 |
| 5,025,284 A | 6/1991 | Komoriya et al. | 355/53 |
| 5,053,614 A | 10/1991 | Yui et al. | 250/205 |
| 5,107,649 A | 4/1992 | Benson et al. | 52/309.4 |
| 5,252,408 A | 10/1993 | Bridges et al. | 428/621 |
| 5,260,344 A | 11/1993 | Ashida et al. | 521/131 |
| 5,271,980 A | 12/1993 | Bell | 428/68 |
| 5,298,342 A | 3/1994 | Laurens et al. | 429/35 |
| 5,304,415 A | 4/1994 | Kurihara et al. | 428/328 |
| 5,346,928 A | 9/1994 | De Vos et al. | 521/166 |
| 5,376,449 A | 12/1994 | Harris et al. | 428/402 |
| 5,395,604 A | 3/1995 | Harris et al. | 423/335 |
| 5,445,857 A | 8/1995 | Nowobilski | 428/69 |
| 5,500,305 A | 3/1996 | Bridges et al. | 428/621 |
| 5,526,093 A | 6/1996 | Takahashi | 355/53 |
| 5,527,411 A | 6/1996 | Jutte | 156/204 |
| 5,550,633 A | 8/1996 | Kamiya | 356/358 |
| 5,559,584 A | 9/1996 | Miyaji et al. | 355/73 |
| 5,601,897 A | 2/1997 | Vermilion et al. | 428/69 |
| 5,618,853 A | 4/1997 | Vonken et al. | 521/60 |
| 5,652,278 A | 7/1997 | Barker et al. | 521/155 |
| 5,664,396 A | 9/1997 | Lyman et al. | 52/788.1 |
| 5,684,278 A | 11/1997 | Yasukawa et al. | 181/286 |
| 5,695,844 A | 12/1997 | Neeser et al. | 428/69 |
| 5,877,843 A | 3/1999 | Takagi et al. | 355/30 |
| 5,885,682 A | 3/1999 | Tanimoto et al. | 428/69 |
| 5,889,067 A | 3/1999 | Jang et al. | 521/117 |

FOREIGN PATENT DOCUMENTS

| | | |
|---|---|---|
| EP | 0605103 A1 | 7/1994 |
| JP | 62-296135 | 12/1987 |
| JP | 2-199814 | 8/1990 |
| JP | 6-325995 | 11/1994 |

*Primary Examiner*—Henry Hung Nguyen
(74) *Attorney, Agent, or Firm*—Westerman, Hattori, Daniels & Adrian, LLP

(57) ABSTRACT

An exposure apparatus for transferring a pattern on a reticle, through a projection optical system, onto a wafer having a photosensitive material coated thereon. The exposure apparatus includes a vacuum heat insulation panel which is applied to at least a part of the structure of the exposure apparatus so as to improve performance of temperature-control in the exposure apparatus.

4 Claims, 3 Drawing Sheets

EXPOSURE APPARATUS

This application is a continuation of prior application Ser. No. 09/580,870 filed May 30, 2000; which is a continuation of prior application Ser. No. 09/977,495 filed Nov. 24, 1997, now abandoned.

BACKGROUND OF THE INVENTION

The present invention relates to an exposure apparatus used in a photolithographic process for producing, for example, semiconductor devices, liquid crystal displays and thin film magnetic heads, among others.

In a photolithographic process for producing semiconductor devices, liquid crystal displays or other products, there have been used exposure apparatuses in which an illumination light beam is utilized for transferring a pattern formed on a photomask or a reticle (a generic term "reticle" is used hereinafter to mean either), through a projection optical system, onto a silicon wafer or a glass substrate (either is meant by the term "wafer" hereinafter) which is photosensitized or coated with a photoresist layer.

In recent years, continuous reduction in linewidth of semiconductor integrated circuits requires higher and higher registration accuracy (i.e., accuracy in alignment between patterns of two layers formed overlaid one on the other on a integrated circuit chip) for exposure apparatus, which accuracy may be, for example, as high as about 50 nm (nanometers). In addition, the size of wafers is increasing from year to year in order to improve productivity, and in fact, 200 mm diameter wafers, which are widely used at present, are being replaced with 300 mm diameter wafers.

Various types of alignment optical systems are used for overlaying an image of a circuit pattern formed on a mask onto a wafer with required registration accuracy, and the practical types of alignment optical systems may be categorized generally into three kinds which are well known in the art. The first is a Through-The-Reticle (TTR) method in which alignment marks formed on a reticle and alignment marks formed on a wafer are observed (or sensed) at a time through the projection lens. The second is a Through-The-Lens (TTL) method in which only alignment marks formed on a wafer are sensed through the projection lens, without sensing alignment marks formed on a reticle. The third is an Off-Axis method in which only alignment marks formed on a wafer are sensed through a microscope system the objective lens of which is disposed at a position distant from the projection lens by a predetermined distance.

Unfortunately, TTR and TTL methods suffer from disadvantage that the alignment light beam, used to illuminate alignment marks, will suffer from chromatic aberration of the projection lens because the wavelengths of the alignment light beam are far different from those of the illumination light beam used for making exposure, and it is a severe technical challenge to correct chromatic aberration of the projection lens with respect to the alignment light beam. The reason why the alignment light beam used for either of these two methods must have such wavelengths is that the alignment light beam should not affect the photoresist layer coated on a wafer, during the alignment process. Further, TTR method suffers from additional problems. For example, TTR method will provide throughput lower than other methods. Further, TTR method has many limitations imposed thereon: for example, TTR method is required to assign wider areas on a reticle to alignment marks formed thereon than any other methods. Due to the above inconveniences associated with TTR and TTL methods, the off-axis method has been most widely used for alignment purposes in recent years.

Nevertheless, the off-axis method has its own drawbacks. For example, the distance between the projection lens (i.e., the projection optical system) and the objective lens of the microscope system (i.e., the off-axis alignment optical system), called the baseline length, may vary under the influence of heat so that the total registration accuracy may be degraded. In other words, the registration accuracy of an off-axis alignment optical system is highly influenced by thermal stability between the projection optical system and the off-axis alignment system. For this reason, the parts or members interconnecting the projection optical system and the off-axis alignment optical system are typically made of low-thermal-expansion materials.

There may be another factor in degradation of the registration accuracy, which factor is the degradation of the measurement accuracy of the laser interferometers used for measuring the position of a stage. The stage may be a stage for carrying a wafer or one for carrying a reticle. While the following description is specifically directed to laser interferometers associated with a wafer stage, it also applies to those associated with a reticle stage. The degradation of the measurement accuracy of the laser interferometers may occur due to a variation in refractive index of air in and around the optical paths of the measuring laser beams. The variation is caused by the air fluctuations arisen from temperature gradient. It is considered that a temperature gradient may occur where a wafer is heated by an illumination light beam illuminated onto the wafer for exposure, and the heated wafer produces an upward stream of relatively hot air rising from around the wafer. One known method for suppressing any variation in refractive index of the air in and around the optical paths of the measuring beams is to produce and maintain a continuous air stream flowing along the optical paths of the measuring beams. Another known method is disclosed by Japanese published patent application No. Hei-2-199814 (No. 199814/1990), in which a local chamber is provided in addition to the main chamber confining the whole exposure apparatus therein, and separate air-conditioning is effected to each of the local and main chambers. This effectively divides the space confined in the local chamber from the remainder in the main chamber, so that the space in the local chamber may be placed under more precise air-conditioning so as to prevent errors in measurements of the laser interferometers.

While it has been long known that registration accuracy of an exposure apparatus may be affected by heat generated in the exposure apparatus, and various solutions to this problem have been proposed as described above, many drawbacks remain in this regard as illustrated below.

First, an exposure apparatus may consist of many parts and members including connection members interconnecting the projection optical system and the off-axis alignment optical system described above, which parts and members are subject to thermal expansions. Using low-thermal-expansion materials to form appropriate parts and members could be one solution if it should be possible. However, in fact, such materials generally have such low rigidities that they are difficult to use for this purpose. For example, a typical low-thermal-expansion glass-ceramic material (such as "Zerodur" (trademark)) has a sufficiently low thermal expansion coefficient of 0.1 ppm/° C. (or $0.1 \times 10^{-6}$/° C.) or less, but its rigidity is very low. Materials usable to form parts and members of an exposure apparatus are limited to those having sufficient rigidities, such as invert glasses and special ceramic materials. Such high-rigidity materials typically have thermal expansion coefficients of the order of 1 ppm/° C. If the required stability in size of members is such that it only allows for a variation of about 1 nm or less in a length of about 0.1 m, then the required stability amounts to within 10 ppb (or $10 \times 10^{-9}$). In order to keep this stability in size with materials having thermal expansion coefficients of about 1 ppm/° C., the stability in temperature within 0.01° C. is required. When conventional heat insulators are used to meet the required stability in temperature, many layers of heat insulating materials have to be overlaid one on another to form such heat insulators. Since the space in an exposure apparatus is so limited, it has been very difficult to achieve the required stability in temperature with conventional heat insulators which can be accommodated in the limited space.

It is to be noted that the limitation on the space in an exposure apparatus of the above type is of great significance as described below. First, reduction of the floor space occupied by an exposure apparatus (this space is often called "footprint") results in considerable saving of costs for the manufacturer. In addition to the footprint, the space limitation also relates to several essential features having influence over the performance of the exposure apparatus. One of the features is the distance between the projection optical system and the surface of a wafer placed under it. The numerical apertures of projection optical systems have been increasing over recent years for the purpose of achieving higher resolution. If the above distance is relatively large and the projection optical system has a high numerical aperture, this results in large diameters of the optical elements used in the projection optical system. As a result, it is difficult to manufacture projection optical systems. In addition, manufacturing costs thereof increase. Further, a larger projection optical system requires higher bending and torsional rigidities of the structure of the exposure apparatus in order to achieve a registration accuracy within a selected allowable error range, because there are some limitations onto the ratio of length to sectional area for the parts and members composing the exposure apparatus.

As described above, low-thermal-expansion materials are useful for avoiding any adverse effects of heat, however they are very difficult to use as materials of parts and members of an exposure apparatus due to their low rigidity. On the other hand, if materials having sufficient rigidity are used as heat insulating layers, it would be required to provide the heat insulating layers having sufficient thickness in order to meet the required stability in temperature for ensuring avoidance of any harmful thermal expansion. This results in inconvenience with respect to the space in the exposure apparatus. For example, if the required stability in temperature should be achieved with heat insulators of a typical, conventional type, they would have to be as thick as about 10 cm. It is practically impossible to apply such thick heat insulators to the parts and members composing the exposure apparatus. The heat insulators for use in exposure apparatuses fundamentally differ from the heat insulators for other uses, such as in refrigerators, and thus this has been long a problem.

Next we will describe in more detail the problem that the registration accuracy may be degraded when the heat generated in an exposure apparatus affects the measurements of the laser interferometers used in the exposure apparatus.

In recent years, the chamber for confining the exposure machine main portion of the exposure apparatus is typically designed such that it confines not only the exposure machine main portion but also various accessories of the exposure apparatus including power supplies for circuit boards of the controller and electric motors, in order to reduce the required floor space occupied by the exposure apparatus. As a result, the amount of heat generated per unit volume of an exposure apparatus is increasing. Under the influence of such heat sources, it is very difficult to keep the temperature distribution less than 0.1° C. This results in a temperature gradient in the exposure apparatus, which in turn produces fluctuations in the air in and around the optical paths of the measuring laser beams from the laser interferometers. Therefor the highest possible stability in measurement through the laser interferometers is limited to 5 nm so far.

The stability in temperature may be improved by confining the wafer stage and the associated laser interferometers in a local chamber and effecting temperature-control to the local chamber by circulating coolant through channels formed in the walls of the local chamber, as described in the above-referenced Japanese published patent application No. Hei-2-199814. This requires, however, a control unit for controlling the temperature of coolant, a circulation pump, piping and other components, resulting in a disadvantageously bulky and complex exposure apparatus occupying an increased floor space (or having an increased footprint).

SUMMARY OF THE INVENTION

In view of the foregoing, it is an object of the present invention to provide an exposure apparatus which may prevent the laser interferometers used therein from producing any erroneous measurements, as well as preventing any adverse effects of the heat generated therein, such as degradation of the total registration accuracy, without using low-rigidity materials.

It is another object of the present invention to provide an exposure apparatus which may achieve a reduced footprint (or space-saving) while avoiding any adverse effects of the heat generated therein.

In order to achieve the above objects, the present invention provides the following arrangements for an exposure apparatus.

In accordance with a first aspect of the present invention, there is provided an exposure apparatus which transfers a pattern formed on a mask onto a substrate, comprising: a vacuum heat insulation panel including a filler providing heat insulation in a vacuum condition and a gas-impermeable envelop enclosing said filler in a vacuum condition; and said vacuum heat insulation panel being applied to at least a part of said exposure apparatus.

In accordance with a second aspect of the present invention, there is provided an exposure apparatus including an exposure machine main portion which transfers a pattern formed on a mask onto a substrate and a chamber enclosing said exposure machine main portion and having a temperature therein maintained at a predetermined temperature, said apparatus comprising: a vacuum heat insulation panel including a filler providing heat insulation in a vacuum condition and a gas-impermeable envelope enclosing said filler in a vacuum condition; and said vacuum heat insulation panel being applied to at least a part of a wall of said chamber.

In accordance with a third aspect of the present invention, there is provided an exposure apparatus according to the second aspect as described above, wherein: said vacuum heat insulation panel may be applied to an inner surface of said wall of said chamber.

In accordance with a fourth aspect of the present invention, there is provided an exposure apparatus including an exposure machine main portion which transfers a pattern formed on a mask onto a substrate and a first chamber enclosing said exposure machine main portion and having a temperature therein maintained at a predetermined temperature, said apparatus comprising: a vacuum heat insulation panel including a filler providing heat insulation in a vacuum condition and a gas-impermeable envelop enclosing said filler in a vacuum condition; a second chamber under air-conditioning conducted separately from said first chamber; and said vacuum heat insulation panel being applied to at least a part of a wall of said second chamber.

In accordance with a fifth aspect of the present invention, there is provided an exposure apparatus including an exposure machine main portion which transfers a pattern formed on a mask onto a substrate and a first chamber enclosing said exposure machine main portion and having temperature therein maintained at a predetermined temperature, said apparatus comprising: a vacuum heat insulation panel including a filler providing heat insulation in a vacuum condition and a gas-impermeable envelop enclosing said filler in a vacuum condition; a stage which carries said mask or said substrate; measuring means which emits a measuring beam toward said stage and sensing a reflection of said measuring beam from said stage so as to measure the position of said stage; a second chamber, disposed in said first chamber, which surrounds a space including a space through which said measuring beam passes; and said vacuum heat insulation panel being applied to at least a part of a wall of said second chamber.

In accordance with a sixth aspect of the present invention, there is provided an exposure apparatus including an exposure machine main portion which transfers a pattern formed on a mask onto a substrate and a chamber containing said exposure machine main portion and having temperature therein maintained at a predetermined temperature, said apparatus comprising: a vacuum heat insulation panel including a filler providing heat insulation in a vacuum condition and a gas-impermeable envelope enclosing said filler in a vacuum condition; and said vacuum heat insulation panel being applied to such a region in said chamber whose temperature is higher than said predetermined temperature.

In accordance with a seventh aspect of the present invention, there is provided an exposure apparatus according to the sixth aspect as described above, preferably further comprising: a projection optical system which projects an illumination light beam, illuminating said mask, onto said substrate; said projection optical system having a lens barrel; and said region whose temperature is higher than said predetermined temperature including at least a part of said lens barrel.

In accordance with an eighth aspect of the present invention, there is provided an exposure apparatus according to the sixth aspect as described above, preferably further comprising: a light source emitting said illumination light beam to said mask; a lamphouse confining said light source therein; and said region whose temperature is higher than said predetermined temperature including at least a part of said lamphouse.

In accordance with a ninth aspect of the present invention, there is provided an exposure apparatus according to the sixth aspect as described above, preferably further comprising: a circuit board box containing a circuit board; and said region whose temperature is higher than said predetermined temperature including at least a part of said circuit board box.

In accordance with a tenth aspect of the present invention, there is provided an exposure apparatus which transfers a pattern onto a substrate, comprising: a vacuum heat insulation panel sealed in a vacuum condition; and said vacuum heat insulation panel being applied to at least a part of said exposure apparatus.

In accordance with an eleventh aspect of the present invention, there is provided an exposure apparatus which transfers a pattern formed on a mask onto a substrate, comprising: an acoustic insulator sealed in a vacuum condition; and said acoustic insulator being applied to at least a part of said exposure apparatus.

BRIEF DESCRIPTION OF THE DRAWINGS

The above and other objects, features and advantages of the present invention will be apparent from the following detailed description of preferred embodiments thereof, reference being made to the accompanying drawings, in which.

DESCRIPTION OF THE PREFERRED EMBODIMENTS

Figure 1:
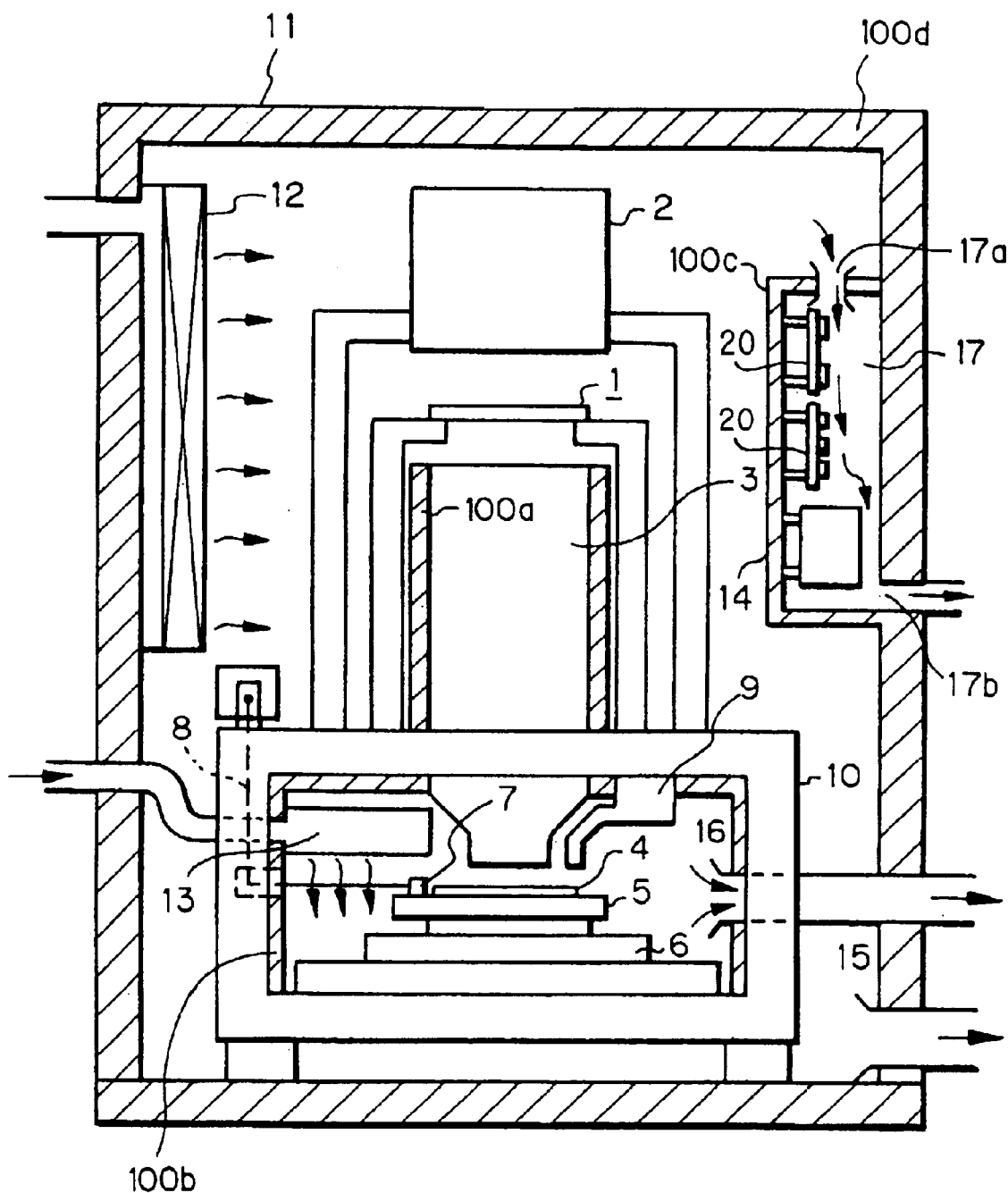
FIG. 1 is a schematic frontal view of an exposure apparatus according to an embodiment of the present invention.

Referring now to the accompanying drawings, a first embodiment of the present invention will be described in detail. FIG. 1 is a schematic frontal view of an exposure apparatus according to the first embodiment. As shown in FIG. 1, a reticle 1 is illuminated by means of an illumination optical system 2, and an image of the reticle 1 is optically formed through a projection optical system 3 on a wafer 4 and thus transferred onto the wafer 4. The wafer 4 is placed on a wafer table 5, which is in turn carried by a wafer stage 6 which is movable along a plane perpendicular to the optical axis of the projection optical system 3. The wafer table 5 has movable mirrors 2 (only one of them is shown in FIG. 1) fixedly mounted thereon. The positions of the movable mirrors 2 are measured by means of associated laser interferometers 8 (only one of them is shown in FIG. 1), and thereby the position of the wafer table 5 is measured. An off-axis alignment optical system 9 (referred to simply "alignment optical system" hereinafter) is provided for measurement for establishing alignment of a wafer. More specifically, the alignment optical system 9 observes (or senses) alignment marks which are formed on a wafer 4 for the alignment purpose.

The essential part of the exposure apparatus, or the exposure machine main portion, is generally composed of the components mentioned above. The whole of the exposure machine main portion is enclosed in an environmental chamber 11 (or first chamber) as shown in FIG. 1. The internal environment within the environmental chamber 11 is continuously supplied with temperature-controlled air from an external air-conditioning unit (not shown), and thereby maintained at a predetermined temperature. The air being supplied is introduced into the environmental chamber 11 through an ultra low penetration air filter (ULPA filter) 12, so that the cleanness of the internal environment within the chamber 11 may be maintained at a predetermined level.

A frame 10 supports the projection optical system 3, the laser interferometers 8 and the alignment optical system 9, as well as defines a confined space for enclosing the wafer table 5 and the wafer stage 6. Thus, the frame 10 is referred to as a chamber (second chamber) in the following description when it is called as the chamber for dividing the confined space from the remainder in the environmental chamber 11. The frame or second chamber 10 provides partition walls defining the confined space, which contains the wafer table 5 and the wafer table, separated from the remainder in the environmental chamber 11. The wafer table 5 contained in the second chamber 10 has the movable mirrors 7 fixedly mounted thereon as described above. The laser interferometers 8 emit laser beams from an outside of the second chamber 11 to the corresponding movable mirrors 7, as shown in FIG. 1, respectively, in order to measure the position of the wafer table 5. Air inlets 13 (only one of them is shown in FIG. 1) are provided along the optical paths of the laser beams from the laser interferometers 8 (of interferometer paths). The air inlets 13 blow out temperature-controlled air continuously supplied from the external air-conditioning unit (not shown). This is done for the purpose of preventing any variation in refractive index of the air in and around the optical paths of the measuring laser beams.

Within the environmental chamber 11 there is provided a circuit board box 14 (serving also as an air outlet box) containing circuit boards 20 and other parts and elements associated therewith. The circuit board box 14 has an air inlet 17a and an air outlet 17b, and a part of the air introduced into the environmental chamber 11 through the filter 12 flows through the air inlet 17a and then the air outlet 17b. The remaining part of the air introduced into the environmental chamber 11 is discharged therefrom through an air outlet 15, while the air introduced into the second chamber 10 is discharged therefrom through an air outlet 16. The discharged air through these outlets 15 and 16 returns to the external air-conditioning unit (not shown).

In particular, according to the first embodiment of the present invention, vacuum heat insulation panels are applied to appropriate places in the exposure apparatus, such as denoted by the hatched areas in FIG. 1. One representative vacuum heat; insulation panel 100 will be described below with reference to FIG. 2.

Figure 2:
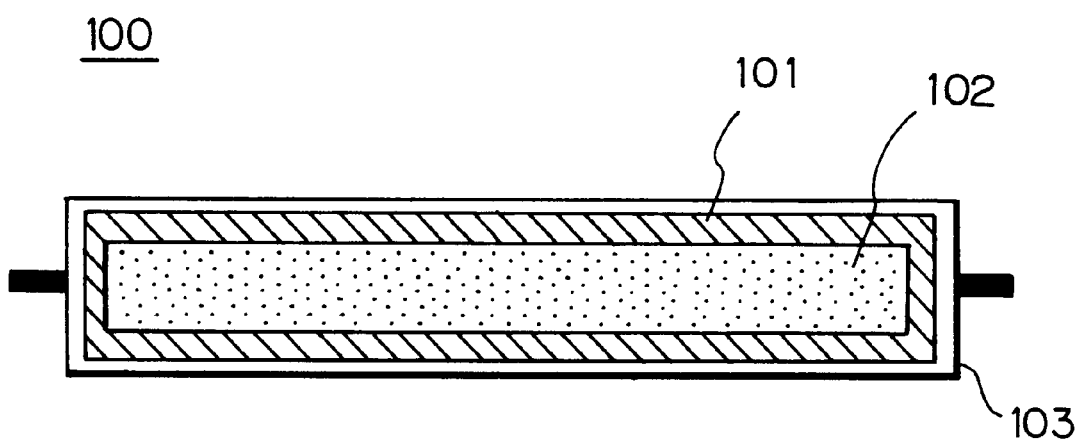
FIG. 2 is a sectional view of a vacuum heat insulation panel.

As shown in FIG. 2, the vacuum heat insulation panel 100 comprises a filler 102, an envelope 101 enclosing the filler 102 in a vacuum condition, and a heat-sealing layer 103 laminated on the envelope 101 to enclose the envelope 101 and the filler 102. The filler 102 may comprise a plate-like piece of any suitable plastic foam or aerogel. Alternatively, it may comprise an amount of silica powder or perlite powder. If a plate-like piece of a suitable plastic foam is used to form the filler 102, it is preferable to select a plastic foam which will not retain gas in the foam cells when the filler is placed in a vacuum condition (i.e., open cell plastic foams are preferable.) This is because any gas retained in the foam cells would serve to transfer heat, resulting in a higher heat conductivity of the vacuum heat insulation panel even when the filler is placed in a vacuum condition. Further, the filler 102 may most preferably comprise an amount of a powder material because powder materials will provide relatively low heat conductivity by virtue of the point contact between adjacent powder particles. In addition, powder particles will effectively scatter heat radiation so that the heat transfer by radiation may be also reduced.

The envelope 101 is a gas-impermeable envelope (or gas-barrier envelope) made from foil of a suitable metallic material (such as aluminum). Thus, the envelope 101 provides barrier or impermeability to air or to water vapor. The envelope 101 has the heat-sealing layer 103 laminated on and applied to an outer surface of the envelope 101. The heat-sealing layer 103 has heat-sealing surfaces on both sides thereof, which will provide adhesion when heated. The adhesion of the heat-sealing surfaces is utilized for the purpose of applying the vacuum heat insulation panel 100 to an appropriate place in the exposure apparatus by heat-sealing as described below, as well as for the purpose of sealing the envelope 101 when it is evacuated of air so as to produce vacuum condition therein.

Thus, the vacuum heat insulation panel 100 is finished by evacuating the envelope 101 to discharge air therefrom. By reducing pressure in the envelope 101 to 0.1 Pa or less, the vacuum heat insulation panel 100 will assume low heat conductivity of about 0.01 W/(m° C.) and thereby provide high heat insulation about ten times that of a typical, non-vacuum heat insulation panel, as described in more detail below.

Let us consider the temperature distribution inside an object. It is well known that, given the heat flux (or rate of flow of heat per unit area: denoted by W) over the surface of an object, the temperature distribution inside the object can be uniquely determined except for its offset. Since the performance of a heat insulating layer may be more explainable in terms of the control of heat flux than in terms of the temperature distribution, the following description will be made from the point of view of the control of heat flux.

Consider the heat exchange between the surface of an object and the ambient air. If the temperature differential between the surface of the object and the ambient air is DT, the area of the surface of the heat insulator is S, and the thermal transmittance is U, the flow of heat J is given by $$J=U(S\Delta T)) \tag{1}$$

The thermal transmittance U may be expressed as a function of two variables k and d $$U(k,d)=1/\{(1/h)+(d/k)\} \tag{2}$$

where: h stands for the heat-transfer coefficient of air by convection; d stands for the thickness of an insulating layer applied to the surface of the object; and k stands for the thermal conductivity of the insulating layer.

This equation may also express the coefficient U where no insulating layer is used as U=U(k, 0). Thus, we use a parameter B representing the performance of any insulating layer, the parameter B being defined by equation $$U(k,d)=BU(k,0) \tag{3}$$

Substituting equation (2) into equation (3), we have $$k=Bdh^2/(1-Bh) \tag{4}$$

This equation gives the required thermal conductivity of the insulating layer for specified values of B, d and h. For example, assuming that h, d and B are specified to typical values which are often used in actual: h=5 W/(m$^{2°}$ C.); d=0.002 m; and B=0.1. (This value of B means that the insulating layer should provide heat insulation which make the flow of heat one tenth.) Substituting these values into equation (4), we obtain the required thermal conductivity of the insulating layer as k=0.01 W/(m ° C.). This level of low thermal conductivity has not been achieved with any of conventional heat insulators. In contrast, the vacuum heat insulation panel 100 described above can in fact achieve thermal conductivity as low as 0.01 W/(m ° C.), so that it can provide heat insulation ten times higher than that obtainable with a typical conventional heat insulator.

Next, we will describe appropriate places in the exposure apparatus to which vacuum heat insulation panels may be suitably applied. As described above, according to the first embodiment of the present invention, vacuum heat insulation panels are applied to the places indicated by the hatched areas in FIG. 1, which places will be described below in detail.

1. Projection Optical System

The projection optical system 3 has a lens barrel for holding lenses therein, which is subject to variation in temperature thereof due to inevitable errors in controlled (or adjusted) temperature in the environmental chamber 11 established by air-conditioning to the environmental chamber 11. Any variation in temperature of the lens barrel will cause thermal expansion/contraction of the lens barrel, resulting in variation in the distance between lenses held in the lens barrel. This in turn causes variation in magnification ratio and/or distortion of the projection optical system 3, with the result that the registration accuracy of the exposure apparatus is degraded. In order to prevent or suppress such degradation in registration accuracy, vacuum heat insulation panels 100a having the same structure as the vacuum heat insulation panel 100 described above are applied to the whole or a part of the side wall of the lens barrel. The vacuum heat insulation panels 100a may be fixed onto the side wall of the lens barrel by heating their heat-sealing layers so as to adhere them directly to the side wall. Alternatively, they may be sandwiched between a pair of metal sheets to form a heat insulating panel, and fixing the panel onto the side wall of the lens barrel by means of suitable fixtures such as screws.

2. Frame (Second Chamber)

For the purpose of preventing any harmful fluctuations of the air in and around the measuring optical path of the laser interferometers 8, an another air-conditioning is effected to the second chamber 10, which is separated from an air-conditioning to the environmental chamber 11. By virtue of this, the air in the second chamber 10 is placed under more precise temperature-control than the air outside the second chamber 10 and inside the environmental chamber 11. Thus, in order to block any harmful disturbances to the second chamber 11, such as the influence of the heat generated outside the second chamber 10 and inside the environmental chamber 11, vacuum heat insulation panels 100b having the same structure as the vacuum heat insulation panel 100 described above are applied to the walls of the second chamber 10. The vacuum heat insulation panels 100b may be fixed onto the inner surfaces of the walls by heat-sealing. Alternatively, the vacuum heat insulation panels 100b may be used to form heat insulating panels with the insulation panels 100b being sandwiched between sheets of any suitable material, and fixing the panels onto the inner surfaces of the walls of the second chamber 10 by means of screws. Further, the vacuum heat insulation panels 100b may be applied to the outer surfaces of the walls of the second chamber 10 rather than or in addition to the application to the inner surfaces of the walls.

3. Circuit Board Box

In the environmental chamber 11, there is disposed the circuit board box 14 containing circuit boards 20 and other components. Since the circuit boards 20 contained in the circuit board box 14 generate heat, the circuit board box 14 itself is a heat source in the environmental chamber 11. Thus, vacuum heat insulation panels 100c having the same structure as the vacuum heat insulation panel 100 are applied to the circuit board box 14. This effectively prevents the heat generated in the circuit board box 14 from transferring to the air outside the circuit board box 14 and inside the environmental chamber 11. The vacuum heat insulation panels 100c may be fixed onto the circuit board box 14 in the same manner as the vacuum heat insulation panels 100b to the second chamber 10.

4. Environmental Chamber

Any environmental chamber enclosing an exposure apparatus therein is generally installed in a clean room maintained at a predetermined temperature. However, the temperature-control effected to the air in a clean room is usually insufficient for the temperature-control for an exposure apparatus. Under the circumstances, vacuum heat insulation panels 100d having the same structure as the vacuum heat insulation panel 100 described above are applied to the environmental chamber 11 in order to keep the temperature in the environmental chamber 11 from any influence of the temperature outside the environmental chamber 11 (i.e., the room temperature in the clean room). The vacuum heat insulation panels 100d may be used to form heat insulating panels with the insulators 100d being sandwiched between sheets of any suitable material, and fixing the panels onto inner and/or outer surfaces of the walls of the environmental chamber 11. Alternatively, if the environmental chamber 11 has a double wall structure including inner walls and outer walls, the vacuum heat insulation panels 100d may be sandwiched between the inner and outer walls. By applying the vacuum heat insulation panels 100d to the walls of the environmental chamber 11 in this manner, the temperature-control to the clean room may be effected with a less severe precision requirement (such as ±0.2° C.), which may lead to lower equipment costs for a semiconductor factory.

Next, a second embodiment of the present invention will be described. The second embodiment includes vacuum heat insulation panels having the same structure as the vacuum heat insulation panel 100 described above and applied to places different from those found in the first embodiment. These places are described below with reference to FIG. 3. Those of elements and components shown in FIG. 3 which provide the same or like functions as those shown in FIG. 1 are denoted by the same reference numerals as used in FIG. 1, and will not be described in detail for simplicity.

Figure 3:
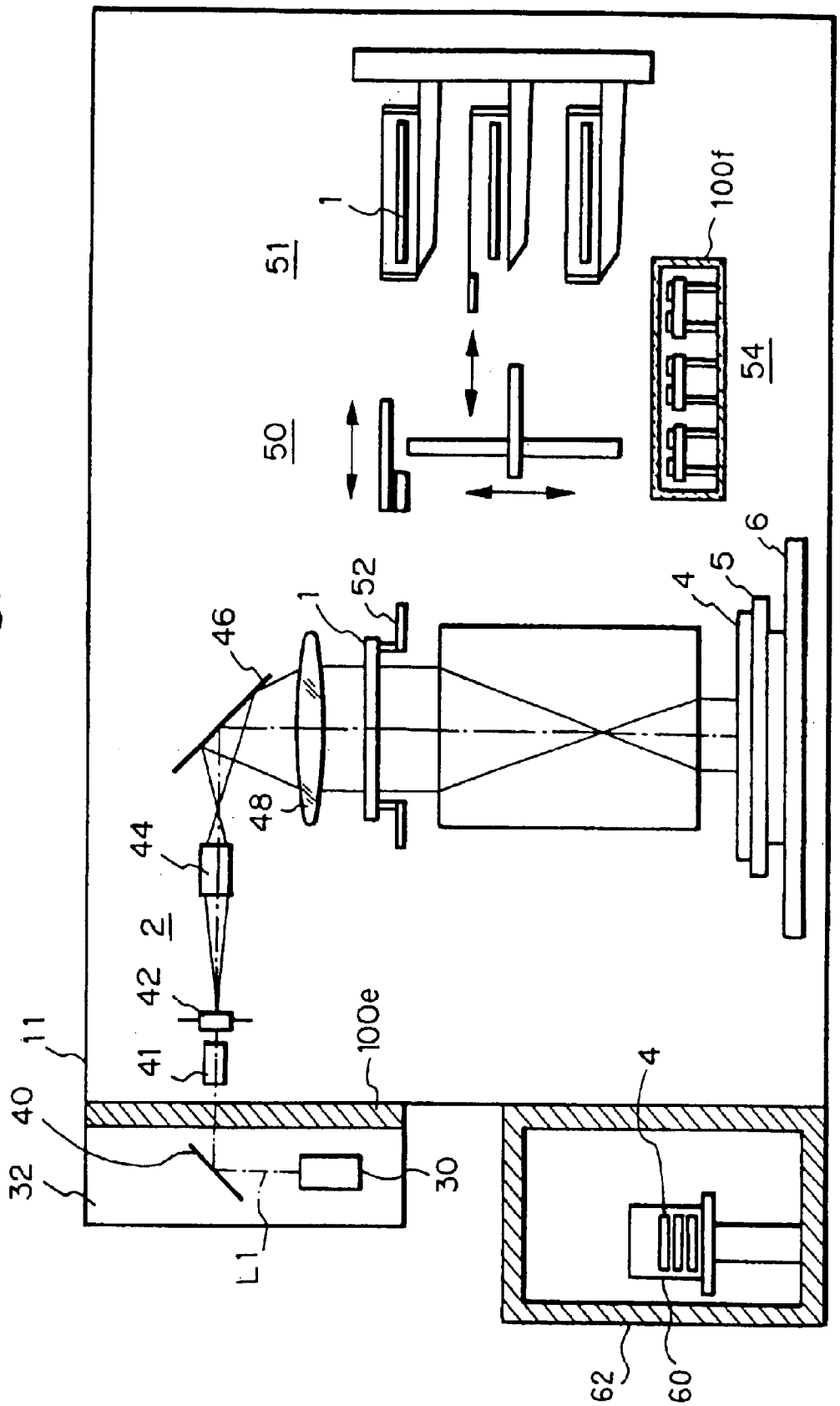
FIG. 3 is a schematic side view of an exposure apparatus according to another embodiment of the present invention.

FIG. 3 is a schematic side view showing an exposure apparatus according to the second embodiment. As shown in FIG. 3, a light source 30 is housed in a lamphouse 32 such that any of the heat generated by the activation of the light source 30 may be kept from flowing out of the lamphouse 32 into an environmental chamber 11. An illumination optical system 2 is provided for illuminating a reticle 1 with an illumination light beam IL emitted from the light source 30. The illumination optical system 2 comprises a mirror 40 for reflecting the illumination light beam IL from the light source 30 to bend its optical path so as to direct it in a horizontal direction. The illumination optical system 2 further comprises a fly-eye optical system 41 including an optical integrator (or fly-eye lens), a relay optical system 44, a dichroic mirror 46 extending above the reticle 1 in a direction angled 45 degrees with respect to the horizontal direction and a main condenser lens 48 disposed between the dichroic mirror 46 and the reticle 1, these components being disposed along the optical path of the illumination light beam IL and in this order in the direction of propagation of the illumination light beam IL reflected by the mirror 40.

As the light source 30 is housed in the lamphouse 32, the temperature in the lamphouse 32 will become higher than that in the environmental chamber 11, so that it is needed to prevent the heat generated in the lamphouse 32 from transferring into the environmental chamber 11. Thus, a vacuum heat insulation panel 100e having the same structure as the vacuum heat insulation panel 100 described above is applied to the wall of the lamphouse 32 (indicated by a hatched area in FIG. 3). It is noted that the lamphouse 32 is mounted against the outer surface of the environmental chamber 11, so that the vacuum heat insulation panel 100e is applied to the wall separating the lamphouse 32 and the environmental chamber 11. In an alternative case where a lamphouse is contained in an environmental chamber, vacuum heat insulation panels may be applied to the inner and/or outer surfaces of all the walls of the lamphouse. In this manner, a precision temperature-control in the environmental chamber 11 may be facilitated, since the environmental chamber 11 is free from the influence of the heat generated in the lamphouse 32.

Moreover, as shown in FIG. 3, a circuit board box 54 containing circuit boards is disposed below a transfer system 50 for transferring reticles between a reticle library 51 for storing reticles 1 and a reticle stage 52 for carrying a reticle 1. Heat is generated in the circuit board box 54, by the circuit boards contained therein. Thus, vacuum heat insulation panels 100f having the same structure as the vacuum heat insulation panel 100 described above are applied to the walls of the circuit board box 54. In this manner, the heat generated in the circuit board box 54 can be effectively prevented from transferring to the air outside the circuit board box 54 and inside the environmental chamber 11.

In addition, as shown in FIG. 3, a wafer library 60 for storing wafers 4 is contained in a dedicated chamber 62, and an another air-conditioning is effected to the chamber 62, which is separated from air-conditioning to the environmental chamber 11. Thus, vacuum heat insulation panels 100g having the same structure as the vacuum heat insulation panel 100 are applied to the walls of the chamber 62.

In the second embodiment thus described, the vacuum heat insulation panels 100e, 100f and 100g may be applied to their places in the same manner as those in the first embodiment. That is, they may be fixed onto their places by adhesion obtained by heating the heat-sealing layer 103, or alternatively by using them to form heat insulating panels and fixing the panels onto inner and/or outer surfaces of the corresponding walls by means of appropriate fixtures such as screws.

It is noted that the places to which the vacuum heat insulation panels 100a to 100g are applied are shown by way of example only, and appropriate places are not limited to them. Rather, the vacuum heat insulation panels may be applied to various other places, such as those adjacent to such parts and members which generate heat and those on such walls which define a space to which local precision temperature-control is effected.

Through the use of the vacuum heat insulation panels having thermal conductivity as low as one tenth that of a typical, conventional heat insulator, applied to appropriate places in the exposure apparatus, the heat flux at each of such places can be effectively controlled so as to facilitate more precise temperature-control. Further, because the vacuum heat insulation panels can be used to form a thinner (or more compact) heat insulating layer than any of conventional heat insulators for the same heat insulation, the floor space occupied by the entire exposure apparatus may be reduced. Moreover, the vacuum heat insulation panels may be used to form a insulating layer even in such a narrow space which allows for no provision of insulating layer formed with conventional heat insulators, so that they may achieve more precise temperature-control from this point of view as well.

While the above description illustrates the use of the vacuum heat insulation panels applied to appropriate places in an exposure apparatus according to the present invention for the purpose of preventing any adverse effects of heat, the present invention is not limited to this as described below. In fact, the present invention also relates to reducing the vibration of an exposure apparatus which may be induced by sounds or acoustic noises produced in the exposure apparatus (or inside the environmental chamber) and/or outside the environmental chamber, as detailed below.

Many recent clean rooms utilize a downflow-type air circulation system in which air is supplied through the entire ceiling area into the clean room to flow down in the clean room toward the floor and then out of the clean room through the entire floor area. Therefor the flow rate of the air is very high. Further, the environmental chamber enclosing an exposure apparatus therein has an air circulation system which circulates air through the environmental chamber, in which the air is caused to pass through an ultra low penetration air filter (ULPA filter) providing a large pressure loss, so that the static pressure (or supply pressure) required for the fan is so high. For these reasons, the acoustic noises produced by fans equipped for a clean room and for an exposure apparatus is rapidly increasing in these years. It is known that such noises will vibrate the exposure apparatus (acoustic vibration) to affect the resolution and registration accuracy of the exposure apparatus. Noise including frequency components whose frequencies are near those of the mechanical resonance peaks of the exposure apparatus may provide severer problems. Such frequencies are about 200 Hz or less. Some conventional environmental chambers have their outer walls formed from plates of steel or aluminum with thickness of about 1 to 2 mm, which are however insufficient for and almost incapable of attenuating acoustic transmission in the frequency range in question. Although a double wall structure may be used in which any of conventional heat insulators are sandwiched between the inner and outer walls, such structure can provide only two times the attenuation obtainable with a single wall structure and thus can not be effective. In contrast, the vacuum heat insulation panel described above provides acoustic insulation to prevent or suppress any acoustic transmission therethrough because of its structure in which air is evacuated and thus absent from the vacuum heat insulation panel.

Thus, according to one aspect of the present invention, the vacuum heat: insulation panels are used as acoustic insulators applied to appropriate places in an exposure apparatus, such as to regions adjacent to noise sources, to the inner and/or outer surfaces of the walls defining a space in which it is desired to prevent any adverse effects of noises. In this manner, any harmful acoustic vibrations possibly occurring in an exposure apparatus may be reduced so as to prevent any adverse effects of the vibrations such as degradation of the registration accuracy of the exposure apparatus.

As clearly understood from the above, according to the present invention, the vacuum heat insulation panels are applied to appropriate places in an exposure apparatus, so that the present invention may facilitate the prevention of any adverse effects of heat such as degradation of the registration accuracy of the exposure apparatus, as well as the reduction in the floor space occupied by the exposure apparatus.

Having described the present invention with reference to several embodiments thereof, it is to be understood that the present invention is not limited to the disclosed embodiments, but may be embodied in various other forms without departing from the spirit and the scope of the present invention as defined by the appended claims.

What is claimed is:

1. An exposure apparatus comprising:

an exposure machine main portion which transfers a pattern on a mask onto a substrate through a projection optical system;

an environment chamber which encloses all of the exposure machine main portion and is maintained at a predetermined temperature; and a vacuum heat insulation panel which comprises a filler, an envelope enclosing the filler therein in a vacuum condition, and a heat-sealing layer laminated on the envelope to enclose the envelope and the filler, and which is fixed on the side wall a lens barrel of the projection optical system, wherein the vacuum heat insulation panel prevents an occurrence of a thermal expansion of the lens barrel.

2. An exposure apparatus comprising:

an exposure machine main portion which transfers a pattern on a mask onto a substrate;

an environment chamber which encloses all of the exposure machine main portion and is maintained at a predetermined temperature;

circuit boards which are connected to the chamber, and which control the exposure machine main portion; and a vacuum heat insulation panel which comprises a filler, an envelope enclosing the filler therein in a vacuum condition, a heat-sealing layer laminated on the envelope to enclose the envelope and the filler, and a pair of metal sheets sandwiching the envelope, the filler, and the heat-sealing layer, wherein the vacuum heat insulation panel composes a wall disposed between the exposure machine main portion and the circuit boards, and wherein the vacuum heat insulation panel prevents an occurrence of a temperature gradient in the environment chamber by transferring heat generated in the circuit boards.

3. An exposure apparatus comprising:

an exposure machine main portion which transfers a pattern on a mask onto a substrate;

an environment chamber having an inner wall and an outer wall which encloses all of the exposure machine main portion and is maintained at a predetermined temperature; and a vacuum heat insulation panel which comprises a filler, an envelope enclosing the filler therein in a vacuum condition, and a heat-sealing layer laminated on the envelope to enclose the envelope and the filler, and which is sandwiched between the inner wall and the outer wall, wherein the vacuum heat insulation panel prevents an occurrence of a temperature gradient in the environment chamber by transferring heat generated outside of the environment chamber.

4. An exposure apparatus comprising:

an exposure machine main portion which transfers a pattern on a mask onto a substrate;

an environment chamber which encloses all of the exposure machine main portion and is maintained at a predetermined temperature; and a vacuum heat insulation panel which comprises a filler, an envelope enclosing the filler therein in a vacuum condition, a heat-sealing layer laminated on the envelope to enclose the envelope and the filler, and a pair of metal sheets sandwiching the envelope, the filler, and the heat-sealing layer;

wherein the vacuum heat insulation panel composes a wall, said wall defining a space to which local precision temperature-control is effected in the environment chamber, and wherein the vacuum heat insulation panel prevents an occurrence of a temperature gradient in the space by transferring heat generated outside of the space.

* * * * *